July 6, 1971 D. I. POMERANTZ 3,591,477
PROCESS FOR GROWTH AND REMOVAL OF PASSIVATING FILMS IN SEMICONDUCTORS
Filed July 17, 1968
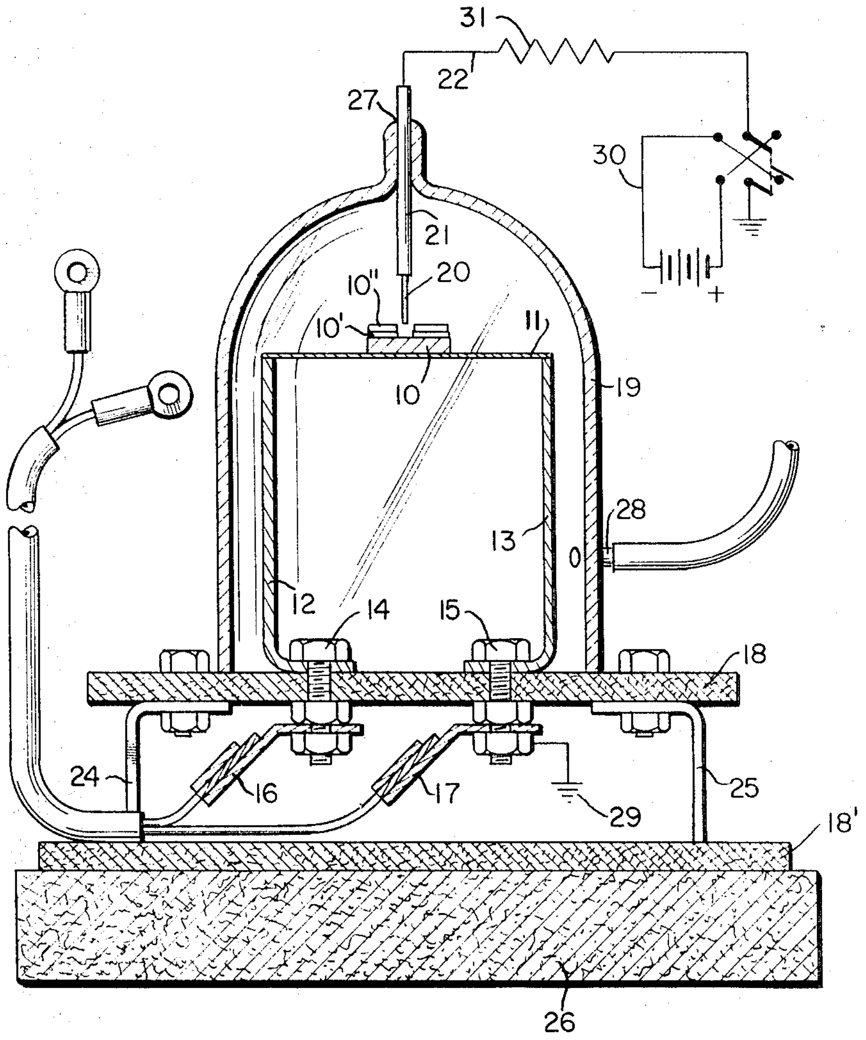
INVENTOR
DANIEL I. POMERANTZ United States Patent Office 3,591,477
Patented July 6, 1971

3,591,477

PROCESS FOR GROWTH AND REMOVAL OF PASSIVATING FILMS IN SEMICONDUCTORS

Daniel I. Pomerantz, Lexington, Mass., assignor to P. R. Mallory & Co. Inc., Indianapolis, Ind.

Continuation-in-part of application Ser. No. 419,972, Dec. 21, 1964. This application July 17, 1968, Ser. No. 745,435
Int. Cl. B01k *1/00*
U.S. Cl. 204—164 28 Claims

ABSTRACT OF THE DISCLOSURE

An insulative passivating film is grown on the surface of a semiconductor slice by heating the slice in a controlled atmosphere in the presence of an electrical discharge between the slice and an electrode. The electrode, supplied with power by a constant-current source, is made cathodic with respect to the slice. Thickness of the film is varied by controlling, among other variables, the current from the source and the time of the discharge. A previously formed passivating film is removed from a semiconductor slice by reversing the polarity of the electrode. Growth or removal of the passivating film may be limited to predetermined areas by the shape or movement of the electrode, or by placing an apertured mask between the electrode and the slice. The foregoing steps may be combined with diffusion and metallization techniques to produce a semiconductor device.

This application is a continuation-in-part of application Ser. No. 419,972, filed Dec. 21, 1964, now abandoned.

Insulative or passivating films are extensively used in the manufacture of semiconductor devices for three major purposes: as a mask for diffusants to localize diffusion, as a dielectric for capacitors, and as an insulator between conductors. It is possible for a single passivating film to serve any or all of these purposes, as well as others, simultaneously. Hereinafter, the terms "passivating film" and "passivating layer" will be used to denote any such surface film, regardless of the particular function within the completed device; the term "passivating material" will denote the material of which the passivating film or layer is composed.

In conventional practice, passivating films are grown thermally to a desired thickness over the entire surface of a semiconductor slice in an atmosphere of steam or wet oxygen at a temperature of approximately 1200° C. Portions of the film are then removed by masking and chemical etching using photolithographic techniques to define the filmed areas to be removed. A standard sequence for carrying out one planar diffusion for fabricating an integrated circuit involves the following steps: (1) passivation of the surface of the slice, usually by oxidation; (2) application of photoresist to the passivating layer; (3) bakeout of the photoresist; (4) registration of a mask and exposure of the photoresist; (5) development of the photoresist; (6) etching away portions of the passivating film; (7) removal of the photoresist material; and (8) diffusion of impurities into the semiconductor through windows in the passivating film. In the fabrication of an integrated circuit, this sequence must be repeated once for each of four or five diffusions, and must be interspersed with other steps involving cleaning of the slice, epitaxial deposition and metallization.

Examining the above sequence, it may be appreciated that most of the steps in fabricating a semiconductor device involve wet chemical treatment related either to the photolithographic process for producing passivating films or to the etching of these films. It has been found in practice that these steps introduce most of the geometrical variance observed in such devices. This is due largely to the limited resolution of the photolithographic process and to variations in the etching of the passivating films. The latter factor may be explained by the fact that a certain amount of undercutting of the passivating film results from etching through the photoresist mask. The amount of undercutting varies with the composition of the etching material as well as with the composition and thickness of the film, which thickness may vary over the surface of the slice. Thus, the edges of the passivating film are typically undefined to dimensions on the order of a few microns. While this resolution is adequate for some present purposes, other present applications and future devices require a higher resolution.

A more fundamental objection to wet chemical processing is the hazard of contamination resulting from numerous handlings of the slice in uncontrolled atmospheres. One of the contaminants most difficult to eliminate is dust. Even with the best filtering, a certain amount of dust will deposit upon the semiconductor slice between steps. After diffusion, each particle of dust remaining on the slice may produce a defect. This fact accounts for the common observation that, in the manufacture of integrated circuits, the yield varies inversely with the chip area, rather than with the product of yields of the individual devices on the chip or slice.

The above considerations create a strong need for processes which can be carried out in highly controllable environments wherein the semiconductor slice need not be handled between fabrication steps. The present invention advances the semiconductor art by meeting these needs.

Accordingly, it is an object of the present invention to provide a method of fabricating semiconductor devices and circuits which eliminates the aforementioned disadvantages of the prior art.

It is an object of the present invention to provide a method of fabricating semiconductor devices and circuits wherein the passivation of the slice, the removal of the passivating film or layer in predetermined areas and the diffusions and metallization are carried out in a single chamber and without handling after the initial placement.

It is also an object of the present invention to provide passivating films which may be grown or removed locally as a function of position on the semiconductor slice.

It is a further object of the invention to provide a process for growing silicon dioxide and other passivating films at relatively low temperatures.

It is still a further object of the invention to provide a process for removing passivating films from semiconductor surfaces without resorting to photographic or wet processing techniques.

Other objects and advantages of the invention, as well as modifications obvious to those skilled in the applicable arts, will become apparent from the following illustrative description considered in conjunction with the accompanying drawing. The drawing is a sectional view of an apparatus for growing and removing passivating films.

Generally speaking, the present invention provides a method for fabricating semiconductor devices and circuits wherein all processes may be carried out in a single chamber by introducing the appropriate materials for passivation, selective removal of the passivating layer, diffusion and metallization. The semiconductor surface is passivated, according to the invention, by heating the semiconductor slice and then making it anodic (i.e., positive) in an electrical discharge. Removal of the passivating film from discrete areas of the slice is carried out by making the semiconductor the cathode in an electrical discharge. It has been found necessary to elevate the temperature of the semiconductor by means other than the heat produced by the discharge, and it has been found that certain gaseous ambients favor the process. The growth or removal of the passivating film may be confined to local areas by using an insulating mask having predetermined apertures of desired shapes in conjunction with an electrode in close proximity thereto or by using an electrode having a predetermined shape or pattern of lateral motion over the semiconductor surface. The electrode may be in the form of a point, an area of selected shape or a broad, flat area configuration. Masks of quartz glass (i.e., amorphous silicon dioxide) have been found preferable from the standpoint of mechanical and dielectric properties, and also because of machinability considerations and temperature stability. Diffusion and metallization steps are carried out as necessary to fabricate a particular device by introducing a suitable atmosphere into the chamber in which growth and removal of the passivating film are accomplished. One of the advantages of the present process lies in the fact that diffusion and metallization methods may be combined with the aforementioned methods of film growth and removal in a unitary process for the complete production of semiconductor devices in a single chamber, without any necessity for employing special or unusual techniques for the diffusion or metallization.

For illustrative purposes, the presently most widespread semiconductor and passivating material, silicon and silicon dioxide respectively, will be considered in greater detail. The following discussion, however, is also applicable to other semiconductors and to films of other passivating materials.

For the removal of a silicon-dioxide passivating film, the oxidized silicon slice is placed on a heating means. A resistance-heated "Kanthal" strip is shown, although any suitable heating means may be substituted therefor. "Kanthal" is a resistance alloy containing about 70% iron, 22% chromium, 5% aluminum and small amounts of cobalt and carbon. A chamber is placed over the silicon slice or wafer in the heating assembly. An electrode is mounted above the slice in the chamber. The tip of the electrode may be a platinum wire which is brought to within about 5 to about 0.2 mm., of the oxidized silicon surface. A reversible-polarity, constant-current power supply is connected with its positive terminal to the electrode and its negative terminal to the "Kanthal" strip, which in turn is in electrical contact with the silicon slice. The silicon is next heated to a temperature above about 800° C., and preferably between 850° C. and 1300° C., in a suitable atmosphere. Representative examples of such atmospheres include air, nitrogen, hydrogen, noble gases such as argon, or even a vacuum. Pressure is not critical, and may range from a vacuum to more than 10 atmospheres. A total pressure of approximately 760 torr, however, eliminates pressure loading upon the chamber used in the process. Additionally, pressures below approximately 300 torr tend to increase somewhat the temperature required for film removal. It has been found that an atmosphere of wet oxygen at substantially 1 atmosphere pressure with a dewpoint of about 80° C. is most convenient.

The current supply is then energized and a conventional current flows from the anode through the oxide to the silicon, which is the cathode. The discharge thus formed may be an arc, although it may also be a glow discharge, especially at reduced pressures. The exact nature of the discharge, however, is thought to be immaterial to the operation of the process. The oxide layer is removed through an electrolytic action. A one-micron film of silicon dioxide can be removed by a current of approximately 50 microamperes in about 10 minutes. Currents from below one microampere to above 10 milliamperes are suitable, although currents from about 5 microamperes to about 200 microamperes are generally preferred. The time required for film removal will vary with the current magnitude and with the film thickness, and may range from about 5 seconds to more than 2 hours. Short time intervals are of course more preferable than long ones; times between 1 and 20 minutes are easily achievable. Film thicknesses commonly found in semiconductor devices, from 0.5 micron to about 2 microns, are easily removable by the present process; however, much thicker film, on the order of 10 to 50 microns may also be removed.

The use of a fine wire electrode produces a small round hole in the oxide film directly under the anode. In general, it is desirable to produce more complex shaped windows in the oxide for the manufacture of semiconductor devices. One method for accomplishing this objective is by moving the anode with respect to the slice during the period of discharge. To confine the discharge and produce narrow, well defined line patterns, a thin insulating mask, preferably of vitreous or amorphous quartz, may be placed in contact with the silicon wafer. Small slots may be cut into this mask by sandblasting or etching. If the anode is placed over a slot in the mask during the discharge, the resulting window in the oxide film conforms closely to the outline of the slot. In order to assure sufficient mechanical strength, the mask is preferably made from about 0.2 mm. to about 2 mm. thick. Then, since the mask is from several hundred to a thousand times as thick as the oxide film to be removed, only a negligible fraction of the total discharge current will flow through the mask material, rather than through the slot in the mask. Therefore, the mask will not be appreciably etched away by the discharge current, even though the mask may have the same chemical composition and structure as the oxide film. Such a localized removal of a passivating film from a semiconductor, without resorting to photolithographic methods, adds a major element of flexibility to semiconductor processing, in that windows in passivating layers may now be produced in the same chamber used for diffusion and metallization. Complete semiconductor devices and circuits may be fabricated in a controlled-atmosphere chamber, with no intervening steps requiring the handling of the slice in the relatively poorly controlled environments associated with wet chemical processing.

In another aspect of the present invention, a passivating film may be grown upon the surface of a semiconductor slice. Such a film may be grown locally, and its thickness may be varied in different areas of the surface of the slice. In the aforementioned example of a silicon semiconductor and a silicon dioxide passivating layer, a thick oxide layer may be required in some areas for diffusion masking and passivation, and a thin layer may be required in other areas, as for example, to serve as a capacitor dielectric. Additionally, the formation of a silicon dioxide layer by thermal growth requires temperatures on the order of 1200° C., while a film grown according to the present invention may employ a temperature as low as 800° C. Films grown at lower temperatures may in general be expected to be more free of strains and imperfections such as fissures and pinholes; such defects are a major source of failure in silicon semiconductor devices. It has been observed that passivating films grown anodically upon an externally heated semiconductor substrate according to the present method are superior in quality to those grown by thermal means alone, as well as to those grown anodically without the use of heat other than that produced by the electrical discharge. A silicon dioxide film, for instance, will be produced upon a silicon surface in an electrical discharge even when the silicon is at room temperature, but the film is pitted and broken unless the silicon is heated to above about 800° C. before the discharge is begun. This is true even though it is at least conceivable that the discharge itself may in some cases heat localized areas of the silicon to temperatures approaching or even exceeding 800° C.

The process for growing a passivating film on a semiconductor surface substantially follows the process for removing a passivating film as outlined above, except that the polarity of the constant-current power supply is reversed. Also, of course, a passivating atmosphere must be employed; that is, the atmosphere must contain a material in gaseous form which is to combine with the semiconductor to form the passivating film, such as oxygen, nitrogen and the like which combines with a semiconductor material, such as silicon, to form a passivating film of, for example, silicon dioxide or silicon nitride. The passivating films usually found in semiconductor devices are less than about 2 microns thick, but films of 50 or more microns may be obtained in the present process merely by increasing the current magnitude or the time during which the current flows. The presently preferred practice in semiconductor fabrication is to grow a passivating film over the entire chip surface, and then to etch it away only at those locations where its presence is not desired. This sequence may be followed in employing the present invention, by using an insulating mask, or particular electrode shapes or movements, only during removal of the film. It is also possible, however, to grow the film in the first instance only in selected locations on the chip, or with different thickness in different locations on the chip. This may be accomplished by motion or shape of the electrode, or by the use of an insulating, apertured mask (again, preferably of quartz glass) during formation of the film. Such localized growth is impossible with conventional thermal passivation processes.

The drawing depicts an apparatus suitable for use with the invention as outlined above. A semiconductor slice or chip 10, which may, for example, be a silicon slice, is placed on a resistance strip 11 which is supported by electrically conductive brackets 12 and 13. These brackets rest on insulating means 18 and are secured thereto by terminal lugs 14 and 15. Terminal leads 16 and 17 are connected to the lugs 14 and 15 and to a heater power supply (not shown). The leads 17 may be grounded at point 29. The silicon slice 10 is enclosed in a chamber or jar 19 having an opening 27 for the introduction of an electrode 20 therethrough. Electrode 20 is surrounded by an insulating means 21 and is connected to a discharge power supply 30 by a lead 22. A resistor 31 may be connected in the lead 22 in order to provide a substantially constant current to the electrode 20. The power supply 30 may be made either positive or negative with respect to the silicon slice 10. The entire assembly is supported by brackets 24 and 25 resting on fiber insulating means 26.

In order to grow an oxide passivating film, which is an anodic process, the silicon slice 10 is first heated by a resistive "Kanthal" strip 11. The electrode 20 is placed about 1 millimeter above the silicon surface. A positive terminal of the constant-current power supply is connected to the electrode 20 and the negative terminal to the strip 11, which is in electrical contact with the slice 10. A wet oxygen atmosphere at about 760 torr is introduced into the chamber 19 through an aperture 28 and the silicon is heated to 1000° C. The supply 30 is then energized, so that current flows from the electrode 20 in a discharge to the slice 10. If a film of varying thickness is desired, an apertured, insulative mask may be placed on the slice or the thickness may be varied by the shape or movement of the electrode 20. A one-micron film will be produced by a current of 50 microamperes flowing for about 10 minutes.

The oxide film may then be removed through an electrolytic action merely by reversing the switch to make the electrode 20 the anode and the silicon 10 the cathode. The same atmospheres, pressures, and currents may be employed as those described for oxide formation. If shaped windows are desired in the film 10′, an apertured quartz-glass mask 10″ may be placed in contact with the film 10′, whose thickness in relation to that of the mask 10″ is shown greatly exaggerated for purposes of clarity.

A process identical to that for film removal may be utilized to etch the silicon (or other semiconductor) itself, in order to isolate various units on the slice 10. Where the discharge current is directed toward an unpassivated area or region of the slice, etching will begin with the commencement of current from the anodic electrode 20. If the current is directed toward a region of the slice which is covered with a passivating layer, etching will occur merely by extending the duration of the current in the film-removal method beyond that which is necessary to remove the layer. That is, in the latter case, the layer is removed to form an unpassivated area, and the current then etches the semiconductor material. An atmosphere consisting substantially entirely of oxygen is preferred for etching the semiconductor material. Pressure is not critical; it may range from a near vacuum to above 10 atmospheres, although a convenient value is about 1 atmosphere.

As has been previously mentioned, the present invention permits the fabrication of an entire semiconductor device or circuit in a single chamber. A passivating layer is grown upon the semiconductor surface as outlined above, and the removal of discrete areas of the film is accomplished merely by reversing the polarity of the electrode. The removal process may also be used to etch the semiconductor and thereby to isolate various devices of a circuit on the slice. The atmosphere in the chamber may then be changed to carry out diffusion processes, which may then be repeated so that layer upon layer of the various elements will be produced. The size and shape of the windows in the film and the character of the diffusions determine the properties of the device or circuit.

A number of elements find use in semiconductor diffusion operations; among these are boron, aluminum, gallium, indium, thallium, phosphorus, arsenic and antimony. Other elements, such as zinc, mercury, sulphur, gold, silver, potassium and manganese also are employed in some cases. A dopant material for diffusion may be in the form of a solid, a liquid, a gas or a plasma (as in the ion-implantation technique). For liquid and gaseous diffusion, the dopant will normally be a constituent of a compound such as for example, arsine, boron, tribromide, diborane, trimethylborate, phosphine, phosphorus oxichloride or phosphorus nitride. In the widely used gas-diffusion method, a gas containing a dopant material is mixed to a concentration between about 1 and about 1000 p.p.m. with a carrier gas, such as dry nitrogen, hydrogen, or a noble gas such as argon. The carrier gas also preferably contains a trace of oxygen. The semiconductor slice must also be heated during diffusion; although any elevated temperature can in some instances be used, temperatures in the range of 700–1300° C. are generally preferable. The time required for completion of one diffusion step may range from less than 1 minute to more than 20 hours; however, times between 30 minutes and 16 hours are preferred.

Metallization of the semiconductor device may also take place in the same chamber which is used for diffusion and for growth and removal of the passivating film. A common method for metallizing a semiconductor slice involves the evaporation of such metals as gold, aluminum and platinum by heating them above their boiling points in a vacuum. The metal vapors then condense upon the semiconductor surface, which is usually maintained at a temperature above 300° C., to form a pattern of metallic contacts. Metallization may also be carried out with refractory metals, such as molybdenum, tungsten and titanium, by the technique of vapor plating, which involves the hydrogen reduction of a halide of the metal at a temperature generally above about 400° C. Other metals, such as, for instance, vanadium, tantalum, nickel and chromium may also be employed for metallization. For the layer thicknesses commonly found in semiconductor devices, namely, from about 0.5 micron to about 10 microns, metallization may require a time from approximately 5 seconds to 1 minute. A metal mask may be placed in contact with the semiconductor wafer in order to limit the metallization pattern to selected areas of the wafer surface.

Although particular mention has been made of silicon and silicon dioxide because of their presently widespread use in solid-state devices, other semiconductors and other passivating films may also find application with the present invention. Examples of such semiconductors may include germanium, silicon carbide, gallium arsenide, gallium phosphide, lead telluride, and cadmium sulfide. Representative examples of passivating materials which may be useful with the present invention include silicon monoxide, silicon nitride, and germanium dioxide, The passivating material need not contain as a constituent the semiconductor material on which it is deposited; for example, a passivating film of silicon dioxide may be grown on or removed from a germanium semiconductor.

Having thus described an illustrative embodiment of my invention, I claim:

1. A method for fabricating a semiconductor device comprising:

maintaining a slice of semiconductor material selected from the group consisting of silicon, germanium, silicon carbide, gallium arsenide, gallium phosphide, lead telluride and cadmium sulfide, at a temperature above about 800° C. in the presence of an atmosphere which forms a film of passivating material selected from the group consisting of silicon dioxide, silicon monoxide, silicon nitride and germanium dioxide, on said slice while causing a direct current electric discharge between said slice and an electrode, said electrode being cathodic with respect to said slice and being positioned at a distance therefrom, to form said film having a thickness of no greater than 50 microns on said slice; maintaining said slice at a temperature above about 800° C. while causing a direct current electrical discharge between said slice and said electrode, said electrode being anodic with respect to said slice and positioned at a distance therefrom, to remove film from said slice; diffusing a dopant material into said slice; metallizing said slice; and repeating the above steps as required to fabricate the device.

2. A method according to claim 1, further comprising maintaining the semiconductor slice at a temperature above about 800° C. while passing a direct current between an unpassivated area of the slice and the electrode, the electrode being anodic with respect to the slice and being positioned at a distance therefrom, thereby etching the slice.

3. A method according to claim 1, wherein the semiconductor slice is silicon.

4. A method according to claim 3, wherein the passivating material is silicon dioxide.

5. A method according to claim 3, further comprising moving the electrode laterally over the semiconductor slice during passage of the current between the slice and the electrode.

6. A method according to claim 3, further comprising placing an apertured mask of an insulating material on the semiconductor slice during passage of current between the slice and the electrode.

7. A method according to claim 6, wherein the insulating material is vitreous quartz.

8. A method for forming a film of passivating material on a semiconductor slice, comprising:

maintaining a slice of semiconductor material selected from the group consisting of silicon, germanium, silicon carbide, gallium arsenide, gallium phosphide, lead telluride and cadmium sulfide, at a temperature above about 800° C. in the presence of an atmosphere which forms a film having a thickness of no greater than 50 microns of passivating material selected from the group consisting of silicon dioxide, silicon monoxide, silicon nitride and germanium dioxide, on said slice while causing a direct current electric discharge between said slice and an electrode, said electrode being cathodic with respect to said slice and positioned at a distance therefrom.

9. A method according to claim 8, wherein the semiconductor is silicon and wherein the passivating material is silicon dioxide.

10. A method according to claim 9, wherein the temperature is in the range from about 850° C. to about 1300° C.

11. A method according to claim 9, wherein the passivating atmosphere contains oxygen.

12. A method according to claim 11, wherein the passivating atmosphere is composed substantially entirely of oxygen.

13. A method according to claim 9, wherein the distance from the electrode to the semiconductor slice is less than about 5 mm.

14. A method according to claim 13, wherein the distance from the electrode to the semiconductor slice is greater than about 0.2 mm.

15. A method according to claim 9, further comprising moving the electrode laterally over the semiconductor slice during passage of the current between the slice and the electrode.

16. A method according to claim 9, further comprising placing an apertured mask of an insulating material on the semiconductor slice during passage of the current between the slice and the electrode.

17. A method according to claim 16, wherein the insulating material is vitreous quartz.

18. A method for removing passivating material selected from the group consisting of silicon dioxide, silicon monoxide, silicon nitride and germanium dioxide from a slice of semiconductor material selected from the group consisting of silicon, germanium, silicon carbide, gallium arsenide, gallium phosphide, lead telluride and cadmium sulfide or for etching said slice comprising: maintaining said slice at a temperature above about 800° C. while causing a direct current electrical discharge between said slice and an electrode, said electrode being anodic with respect to said slice and positioned at a distance therefrom.

19. A method according to claim 18, wherein the semiconductor material is silicon and the passivating material is silicon dioxide.

20. A method according to claim 19, wherein the temperature is in the range from about 850° C. to about 1300° C.

21. A method according to claim 19, wherein the distance from the electrode to the semiconductor slice is less than about 5 mm.

22. A method according to claim 21, wherein the distance from the electrode to the semiconductor slice is greater than about 0.2 mm.

23. A method according to claim 19, further comprising moving the electrode laterally over the semiconductor slice during passage of the current between the slice and the electrode.

24. A method according to claim 19, further comprising placing an apertured mask of an insulating material on the semiconductor slice during passage of the current between the slice and the electrode.

25. A method according to claim 22, wherein the insulating material is vitreous quartz.

26. A method according to claim 19, further comprising surrounding the semiconductor slice with an atmosphere containing oxygen.

27. A method according to claim 26, wherein the atmosphere is composed substantially entirely of wet oxygen.

28. A method according to claim 27, wherein the atmosphere has a dew point of about 80° C.

References Cited

UNITED STATES PATENTS

| | | | |
|---|---|---|---|
| 2,750,544 | 6/1956 | Pfann | 204—164 |
| 3,337,438 | 8/1967 | Gobeli et al. | 204—164 |

| | | | |
|---|---|---|---|
| 3,321,390 | 5/1967 | Weber | 204—164 |
| 3,336,211 | 8/1967 | Mayer | 204—164 |
| 3,366,562 | 1/1968 | Brenner | 204—164 |
| 3,394,066 | 7/1968 | Miles | 204—164 |

HOWARD S. WILLIAMS, Primary Examiner

N. A. KAPLAN, Assistant Examiner

U.S. Cl. X.R.

204—192